(12) United States Patent
Ealey (10) Patent No.: US 6,947,201 B2
(45) Date of Patent: Sep. 20, 2005

(54) TRANSVERSE ELECTRODISPLACIVE ACTUATOR ARRAY

(75) Inventor: Mark A. Ealey, Littleton, MA (US)

(73) Assignee: Xinetics, Inc., Devens, MA (US)

(*) Notice: Subject to any disclaimer, the term of this patent is extended or adjusted under 35 U.S.C. 154(b) by 0 days.

(21) Appl. No.: 10/730,514

(22) Filed: Dec. 8, 2003

(65) Prior Publication Data

US 2005/0128558 A1  Jun. 16, 2005

(51) Int. Cl.[7] .................. G02B 26/00; G02B 26/08; G02B 5/08
(52) U.S. Cl. .................. 359/295; 359/291; 359/224; 359/845
(58) Field of Search .................. 359/295, 290, 359/291, 298, 214, 221, 224, 230, 279, 845, 359/850, 871, 872, 242; 29/593; 216/24; 310/26, 328; 257/98

(56) References Cited

U.S. PATENT DOCUMENTS

| | | | | |
|---|---|---|---|---|
| 3,479,109 A | * | 11/1969 | Kendall, Jr. .................. | 359/295 |
| 3,904,274 A | * | 9/1975 | Feinleib et al. .............. | 359/295 |
| 4,248,504 A | * | 2/1981 | Albertinetti et al. ........ | 359/295 |
| 4,257,686 A | * | 3/1981 | Albertinetti et al. ........ | 359/295 |
| 4,861,149 A | | 8/1989 | Ealey .......................... | 359/849 |
| 4,906,087 A | | 3/1990 | Ealey et al. ................. | 359/849 |
| 4,923,302 A | | 5/1990 | Ealey et al. ................. | 356/601 |
| 4,932,119 A | | 6/1990 | Ealey et al. .................. | 29/593 |
| 4,934,803 A | | 6/1990 | Ealey .......................... | 359/845 |
| 4,940,318 A | | 7/1990 | Ealey et al. ................. | 359/849 |
| 4,959,567 A | | 9/1990 | Ealey et al. .................. | 310/26 |
| 5,037,184 A | | 8/1991 | Ealey .......................... | 359/849 |
| 5,037,190 A | | 8/1991 | Ealey et al. ................. | 359/845 |
| 5,094,519 A | | 3/1992 | Ealey et al. ................. | 359/845 |
| 5,481,396 A | | 1/1996 | Ji et al. ....................... | 359/295 |
| 5,552,923 A | * | 9/1996 | Min ............................ | 359/224 |
| 5,589,084 A | | 12/1996 | Ji et al. ....................... | 216/24 |
| 5,616,982 A | | 4/1997 | Um et al. .................... | 310/328 |
| 5,689,380 A | | 11/1997 | Um .............................. | 359/846 |
| 5,696,618 A | * | 12/1997 | Ji et al. ....................... | 359/224 |
| 5,710,657 A | | 1/1998 | Um .............................. | 359/295 |
| 5,835,293 A | | 11/1998 | Min et al. ................... | 359/850 |
| 5,841,569 A | * | 11/1998 | Kim ............................ | 359/291 |
| 5,859,724 A | * | 1/1999 | Nam ........................... | 359/295 |
| 5,862,275 A | * | 1/1999 | Takeuchi et al. .............. | 385/19 |
| 5,877,517 A | | 3/1999 | Jung ............................ | 257/98 |
| 5,877,889 A | * | 3/1999 | Um et al. .................... | 359/295 |
| 5,920,422 A | * | 7/1999 | Kim ............................ | 359/295 |
| 6,043,925 A | * | 3/2000 | Ryu et al. .................... | 359/291 |

* cited by examiner

Primary Examiner—Loha Ben
(74) Attorney, Agent, or Firm—Iandiorio & Teska (57) ABSTRACT

A transverse electrodisplacive actuator array for controlling the optical phasing of a reflective surface includes a support structure; a plurality of electrodisplacive actuator elements extending from a proximate end at the support structure to a distal end; each actuator element including at least one addressable electrode and one common electrode spaced from the addressable electrode and extending along the direction of said proximate and distal ends along the transverse $d_{31}$ strain axis; a reflective member having a reflective surface and a mounting surface mounted on the actuator elements; and a plurality of addressable contacts and at least one common contact for applying voltage to the addressable and common electrodes to induce a transverse strain in addressed actuator elements to effect an optical phase change in the reflective surface at the addressed actuator elements.

17 Claims, 8 Drawing Sheets

TRANSVERSE ELECTRODISPLACIVE ACTUATOR ARRAY

FIELD OF THE INVENTION

This invention relates to a transverse electrodisplacive actuator array for controlling the optical phasing of a reflective surface.

BACKGROUND OF THE INVENTION

Historically, electroceramic actuators such as piezoelectric lead-zironcate titanate (PZT) or electrostrictive lead-magnesium-niobate (PMN) were operated in a configuration such that the electrodes were connected electrically in parallel and the ceramic layers were connect mechanically in series. See U.S. Pat. No. 4,932,119. The longitudinal strain component was utilized to produce the actuator displacement and force. For electric fields of 30V/mil ($1\times10^6$ V/mm), less than 0.10 _m per layer was attained for a 0.007 inch active layer thickness (consistent with a strain of 800 ppm). To attain free actuator strokes approaching 10-m nearly 100 active layers were required to produce the necessary electrostrain. The net result is a complex mutilayer actuator configuration which is very sensitive to electrostrain induced stress failure. Electrically induced strain and stress in ceramic transducers are principle components in the fatigue, degradation, and eventual breakdown of electroceramic actuators. The basic failure mechanism involves the transverse component of electrostrain. Flaws in the ceramic structure such as voids and impurities also create localized regions of very large stresses. PMN being electrostrictive by its very nature has a longitudinal strain component parallel to the applied electric field direction (or perpendicular to the electrodes) and a transverse component which is negative in sign perpendicular to the filed direction. The electrostriction process is a constant volume process so the over all volume of the actuator is nearly constant even during electrical activation. The platinum electrodes attempt to impede the transverse strain or shrinkage of the actuator. Hence the elastic modulus of platinum is high ($23.0\times10^6$ PSI) compared to PMN ($17.5\times10^6$ PSI), the result is a potentially high shear stress component at the PNM/Pt electrode interface. In fact the shear stress is directly proportional to the magnitude of the strain and hence the applied electric field. The PMN/Pt interface is a bond which behaves much like an adhesive bond (strong in compression, moderately strong in tension, and very weak in shear). It is not surprising that nearly all electrically induced failure occurs at this interface, not in the ceramic.

Electrical connections are problemistic in the longitudinal multilayer configuration. A multilayer configuration, using the longitudinal electrostrain component, is required to provide sufficient stroke since large strain materials necessary for a single layer device exhibit significant hysteresis and limited fatigue life. All of the exposed electrodes must be connected either to ground or the field addressing source in an alternating fashion. Care must be taken to provide a ceramic insulation layer between adjacent electrodes of opposite polarity to prevent shorting the actuator when connecting the alternating electrode layers. In addition for interactuator spacing below 2.5 mm, it becomes impractical to individually route the electrical contact (both at electrodes and to the electronic driver). As the packing density increases, corresponding to better than 25 channels per $cm^2$ (2.0 mm spacing) the manufacturing tolerance becomes very critical. In fact the ceramic shrinkage becomes a greater variable than the actual machining. Electrical interconnection becomes impractical for individual connection. In short with the current longitudinal actuator arrangement, structural stresses, electrical interconnections, and manufacturing tolerances limit the practical implementation of the multilayer actuator technology to >2.5 mm interactuator spacing. Still in order to achieve the necessary displacement, a multilayer configuration is required which leads to the aforementioned structural stress and electrical interconnect problems.

BRIEF SUMMARY OF THE INVENTION

It is therefore an object of this invention to provide an improved transverse electrodisplacive actuator array for controlling the optical phasing of a reflective surface.

It is a further object of this invention to provide such an improved transverse electrodisplacive actuator array which is scalable, has a large stroke, operating at low voltage, high bandwidth, and high resolution.

It is a further object of this invention to provide such an improved transverse electrodisplacive actuator array which reduces interfacial stress between the electrode and ceramic or other material of the actuator.

It is a further object of this invention to provide such an improved transverse electrodisplacive actuator array which reduces the complexity of the electrical interconnection.

It is a further object of this invention to provide such an improved transverse electrodisplacive actuator array which is more modular.

It is a further object of this invention to provide such an improved transverse electrodisplacive actuator array which operates at high applied fields without voltage or current breakdown and therefore can operate at high authority, i.e. high frequency and high stroke simultaneously.

It is a further object of this invention to provide such an improved transverse electrodisplacive actuator array whose stroke is dependent on length not number of laminates.

It is a further object of this invention to provide such an improved transverse electrodisplacive actuator array which is capable of operation at temperature extremes such as cryogenics.

It is a further object of this invention to provide such an improved transverse electrodisplacive actuator array which is scalable by assembling a number of such arrays.

The invention results from the realization that an improved electrodisplacive actuator array for controlling the optical phasing of a reflective surface having reduced interfacial stress between the actuator element material and the electrodes and having a stroke dependent on the length of the actuator element not the number of laminates stacked can be achieved by utilizing the transverse instead of the longitudinal strain to move the reflective surface and that this can be effected by orienting the electrodes of each actuator element longitudinally instead of laterally so that the force is applied in the $d_{31}$ axis with the laminations of electrodes and actuator element ceramic instead of in the $d_{33}$ axis through the laminations thereby reducing the stress on the interfaces and removing them from the axis of the displacement.

This invention features a transverse electrodisplacive actuator array for controlling the optical phasing of a reflective surface. There is a support structure and a plurality of electrodisplacive actuator elements extending from a proximate end at the support structure to a distal end. Each actuator element includes at least one addressable electrode and one common electrode spaced from the addressable electrode and extending along the direction of said proximate and distal ends along the transverse $d_{31}$ strain axis. A reflective member has a reflective surface and a mounting surface on the actuator elements. There is a plurality of addressable contacts and at least one common contact, for applying voltage to the addressable and common electrodes to induce a transverse strain in addressed actuator elements to effect an optical phase change in the reflective surface at the addressed actuator elements.

In a preferred embodiment the support structure and the actuator elements may be integral. The actuator elements may be electrostrictive, magnetostrictive, or piezoelectric. They may include a material such as a ceramic, for example, lead-magnesium-niobate. The addressable contacts may be on a surface of the support structure. The addressable electrodes may extend through the support structure to the addressable contacts. The common contact may be on the surface of the support structure. The common electrodes may extend through the support structure to the common contact on the support structure. The common contact may be on the reflective member. The electrodes may extend through the actuator elements to the common contact on the reflective member. The actuator elements may be a ferroelectric material, including ferromagnetic. The material may be lead zirconate titanate. The material may be any suitable ferroic ceramic. The reflective surface may be continuous. The actuator elements may be made of a single crystal material bonded with interleaved electrodes. The actuator element may be made of co-fired interleaved ceramic layers and electrodes.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

Figure 1:
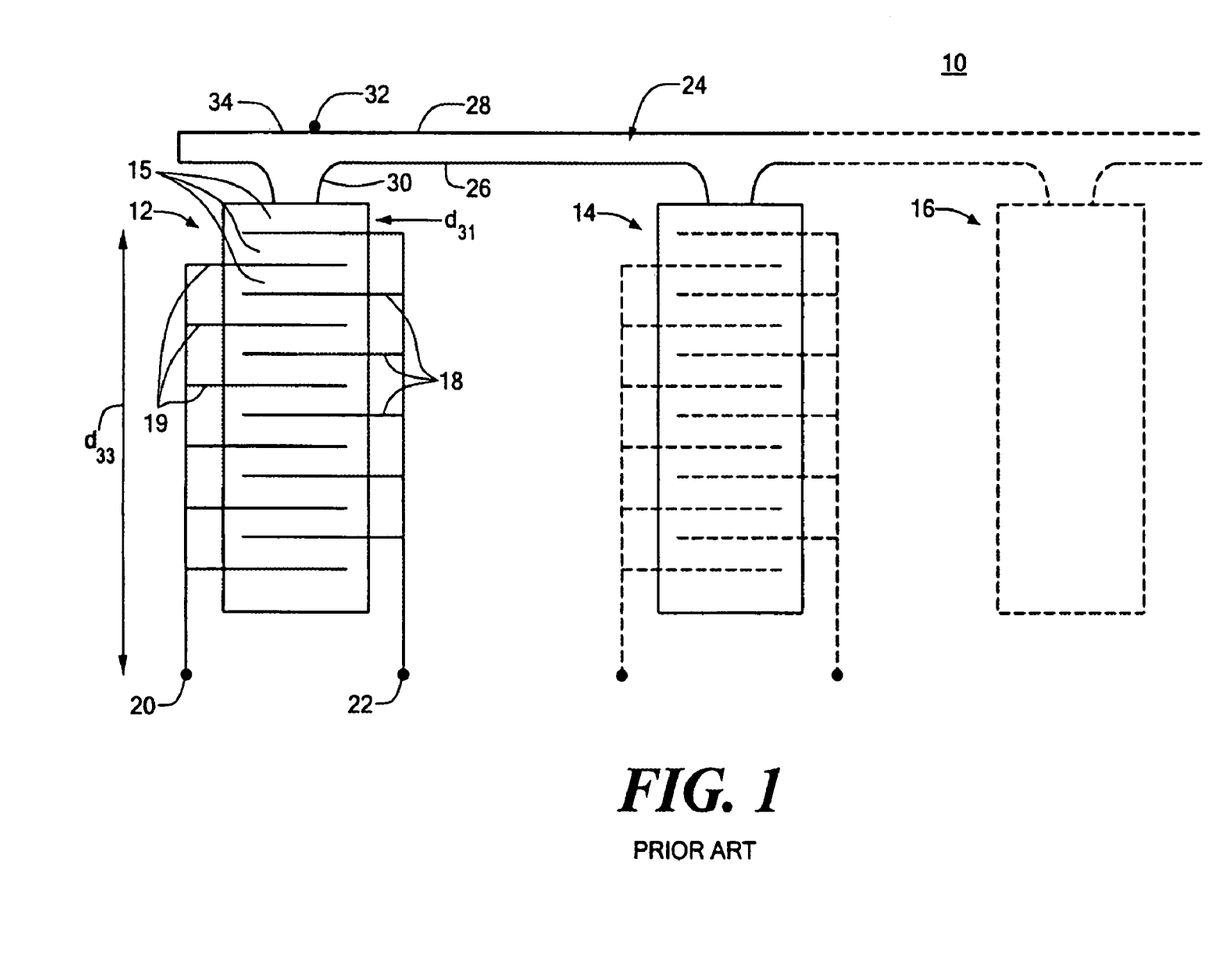
FIG. 1 is a simplified schematic view of a prior art longitudinal electrodisplacive actuator.

There is shown in FIG. 1, a longitudinal electrodisplacive actuator array 10, including a plurality of actuators, 12, 14, 16, each of which is constructed as explained with respect to actuator 12, which is formed in a laminar construction comprising layers of a ferroic material, that is, a ferroelectric or ferromagnetic material. For example, it may be a ferroelectric material, such as, lead magnesium niobate (PMN); a ceramic material which exhibits electrostrictive characteristics. Actuator 12 includes a plurality of layers of the electrostrictive ceramic PMN of layers 15 of the electrostrictive ceramic material PMN interspersed with two sets of electrodes which connect to contacts 20 and 22 respectively. The layers of ceramic material, 14 and the electrodes, 18 and 19 are interleaved in a laminar fashion. An application of voltage to contacts 20 and 22 causes the stack to expand and contract along the longitudinal axis $d_{33}$ depending upon the polarity of the voltage applied. In the transverse axis, $d_{31}$, the material acts the opposite. That is, it is basically a constant volume function: when there is an expansion along axis $d_{33}$, there is a contraction along axis $d_{31}$; and conversely when there is a contraction along axis $d_{33}$ there is an expansion along axis $d_{31}$. This contraction and expansion is communicated to reflective member 24, which consists of a mounting surface 26 and a reflective surface, 28. The mounting surface, 26, includes detents 30, which may be connected to actuator 14, by any suitable adhesive or bonding technique. Thus, when actuator 12 expands a bump, 32 forms on the surface 28, and when actuator 12 contracts, a dimple or depression, 34 occurs on surface 28 at the actuator.

Figure 2:
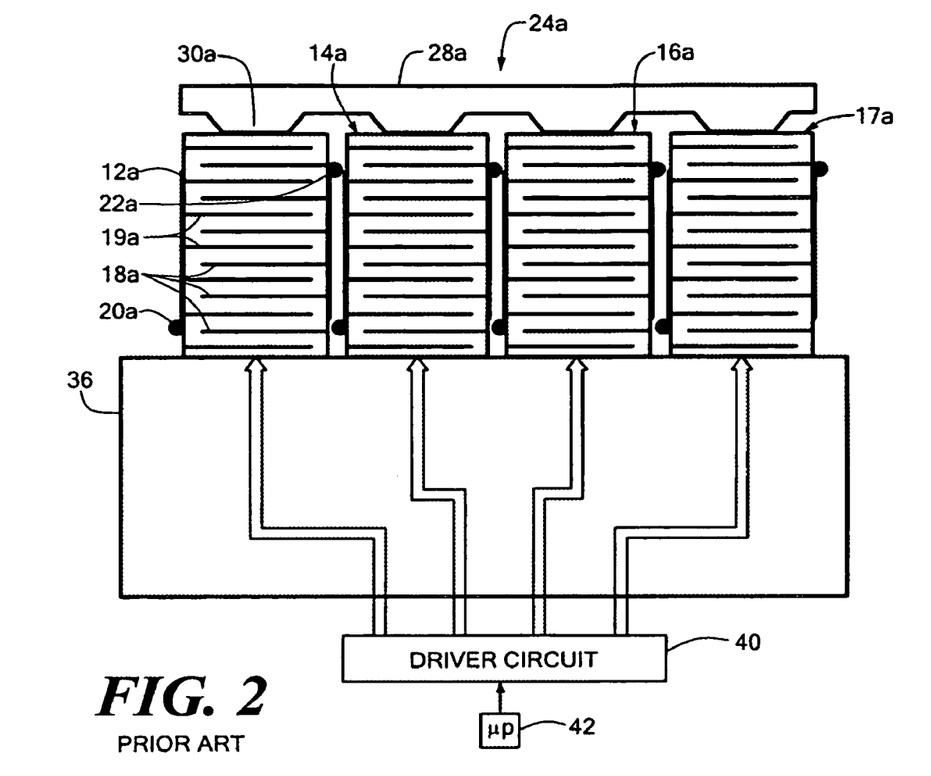
FIG. 2 is a simplified schematic view of a prior art longitudinal electrodisplacive actuator array using the longitudinal electrodisplacive actuator of FIG. 1.

Typically, a number of such actuators, 12a, 14a, 16a, 17a, FIG. 2, are carried on a support structure, 36, FIG. 2, and the contacts, 20a, 22a, of each of the actuators, 12a, 14a, 16a, 17a, are driven by a driver circuit, 40, controlled by a microprocessor, 42, for example, which programs the driver circuit to address selected ones of the actuator to cause dimples and bumps, in the local areas of reflective member 24a, associated with the selective actuators in order to shape the wave front produced by reflective surface 28a.

Figure 3:
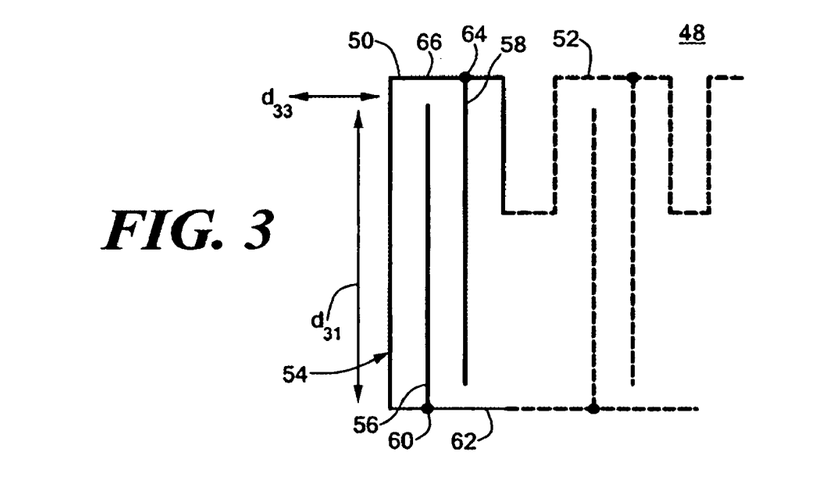
FIG. 3 is a simplified schematic view of a transverse electrodisplacive actuator according to this invention.

In contrast the transverse electrodisplacive actuator array 48 according to this invention includes a plurality of actuators, 50, 52, FIG. 3, mounted on support structure 54, which utilizes the strain along the transverse axis $d_{31}$, rather than along the longitudinal axis $d_{33}$ to expand and contract actuator 50. In this case, each actuator includes at least two electrodes, an addressable electrode, 56 and a common electrode 58. Addressable electrode 56 connects to contact 60 on the surface 62 of support structure 54, while common electrode 58 connects to contact 64, on surface 66. In the construction, according to this invention, the electrodes are generally parallel to the direction of expansion and contraction as opposed to transverse to it. One advantage is that the interfacial stress is no longer a factor, as any separation or crack that occurs is not in series with the force or displacement, but rather transverse to it, so that it will not effect the operation of the device. In addition, the stroke obtained is no longer dependent on the number of electrodes and ceramic layers in the laminate stack, as in actuator 12, FIG. 1, but rather is dependent on the length of actuator 50, FIG. 3.

Figure 4:
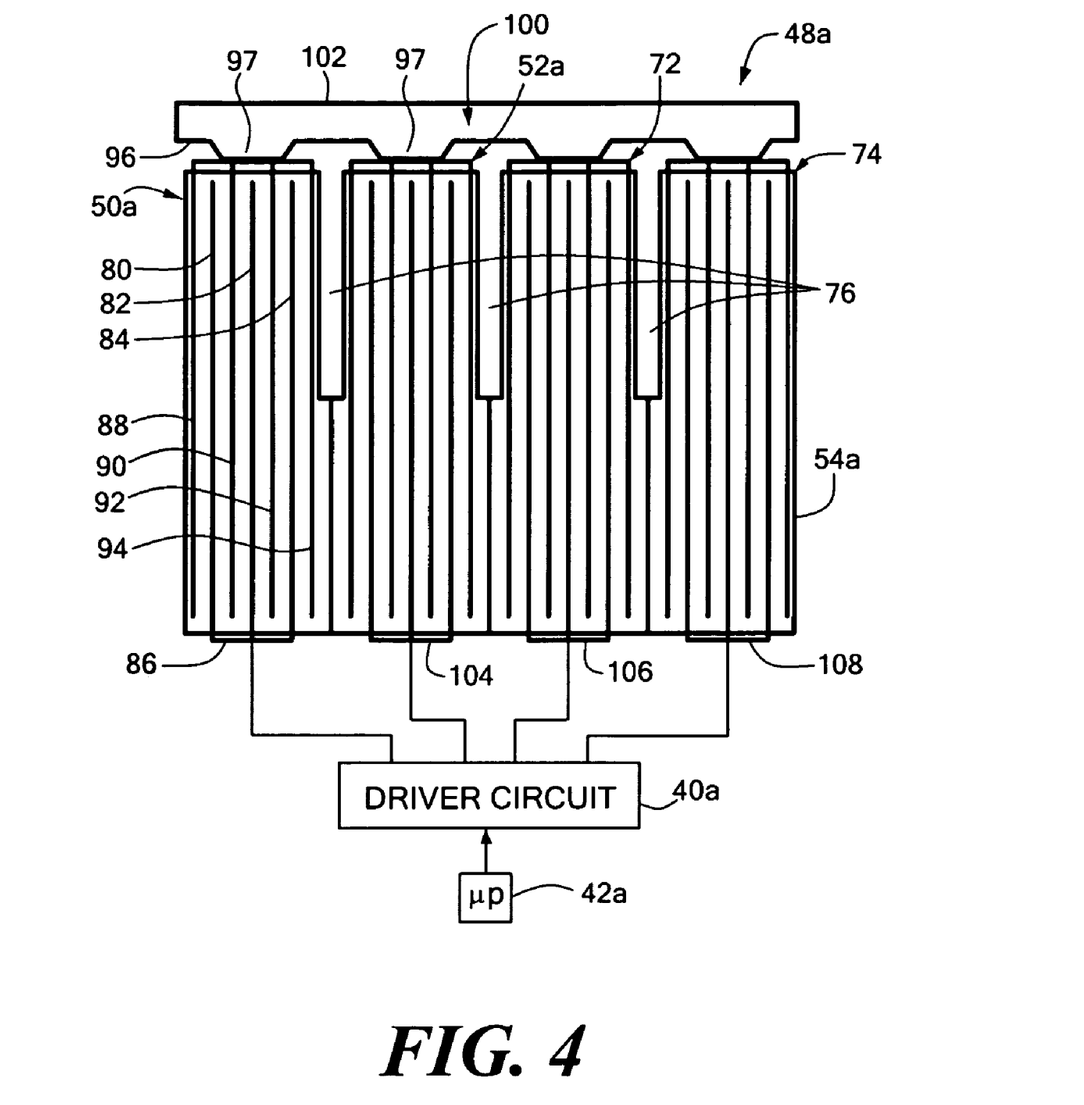
FIG. 4 is a simplified schematic view of a transverse electrodisplacive actuator array according to this invention using the transverse electrodisplacive actuator of FIG. 3.

Actuator 50, 52, FIG. 3, may be a part of a larger array 48a, FIG. 4, which includes a number of actuators, 50a, 52a, 72, and 74. Actuators 50a, 52a, 72 and 74 are mounted on support structure 54a, which may be integral with them.

Their separation may be effected by kerfs or saw cuts, 76, which separate them in two dimensions from each other, so they can act as independent elements. Also, as shown, each element may have more than just one addressable electrode and one common electrode. For example, as shown in FIG. 4 with respect to actuator 50a, there are three addressable electrodes, 80, 82, and 84, which are connected as a unit to addressable contact 86. And there may be more than one common electrode. For example, there may be four common electrodes 88, 90, 92, and 94 are connected as a unit to common contact 96, which is plated on the mounting surface, 98 of reflective member 100. Reflective member 100 contains on its other side the reflective surface 102, which is typically a continuous surface. Thus by selectively addressing addressable contact 86 one can cause actuator 50a to expand or contract and cause a bulge or depression in surface 102 in the locality of actuator 50a. Similarly when addressable contacts 104, 106, and 108 are selected surface 102 will be driven in the area local to the associated actuators 50a, 52a, 72, 74 respectively, to form a bulge or a depression depending upon the voltage applied to shape the optical wave front being reflected from surface 102. Typically the voltage applied may have a quiescent level at 70 volts, so that an increase of 30 volts will drive the actuator in one direction to expand or contract and a decease in voltage of 30 volts would drive it in the other. Detents 97 of mounting surface 98 are connected to actuators 52a, 54a, 72 and 74 by any suitable adhesive or bonding technique. The actuator elements have their proximate ends supported by the support structure. Their distal ends support the reflective member. The addressable and common electrodes are spaced apart and generally parallel to each other. The electrodes extend along in the direction of the proximate and distal ends of the actuator elements along the transverse $d_{31}$ strain axis.

The transverse electrodisplacive actuator array of this invention utilizes the transverse strain of a ferroic e.g. ferroelectric or ferromagnetic material such as an electrostrictive ceramic, lead magnesium niobate (PMN), to produce a scalable, large stroke microactuator which operates at low voltage and works well in the area of 293K° (room temperature). Using other materials such as tungsten based on strontium based materials allows for operation in the area of 125K–200K and 30K–65K, respectively. By utilizing the transverse strain component, the ceramic/electrode interfacial stress is reduced and the electrical interconnection of a densely packed structure is simplified. The electrode interface structure is less sensitive to machining tolerances, is more modular in terms of performance and reproducibility, and is more cost effective. Fewer laminates are required to form the actuator and the length is scaled to meet stroke requirements. Electrical interconnection is accomplished by incorporating printed circuit board technology in a common back plane. The transverse electrodisplacive actuator arrangement provides a scalable configuration compatible with up to $10^7$ channels of operation. The problems associated with the longitudinal multilayer actuator (electrical interconnects, interfacial stress, and precision machining during manufacture) are resolved by incorporating the transverse mode of operation. Array 48 may be made of a co-fired interleaved ceramic and electrode layers or may be made of a single crystal material such as but not limited to lead magnesium nitrate, lead zirconate nitrate.

The transverse electrodisplacive actuator array of this invention utilizes the transverse electrostrictive strain of PMN or other ferroic, ferroelectric or ferromagnetic material to produce a large stroke, low voltage displacement microactuator without requiring a stress sensitive multilayer construction process. Due to the transverse orientation, the structural load path is entirely through the ceramic, not through the electrode/ceramic interface. Furthermore, the interface stress is greatly decreased since the dimensional change in the longitudinal direction is small and inactive material mechanical clamping or pinning is eliminated. Stroke is attained by adjusting the length, not by adding additional layers.

Delineating a monolithic block of ceramic into discrete actuators is accomplished by standard microsawing techniques. The transverse configuration is a fault tolerant design which does not require precision tolerances to prevent damaging or shorting out electrodes during manufacture. Electrical interconnection of electrodes is greatly simplified. Electrical addressing of individual actuators is accomplished through the monolithic block which is polished and contains exposed electrodes. Printed circuit technology is used to provide the electrical interconnection between the discrete addressing actuator channels and the electronic driver. The result is a microactuator technology capable of providing sufficient stroke even at very small interactuator spacing without the need for multilayer construction or microscopic electrical interconnections. The design is easily fabricated without precision machining and is extremely stress tolerant during electrical activation. Furthermore, the design is inherently low voltage which is compatible with hybrid microelectronic driver technology. Electrical addressing and interconnection is done at a common back plane which lends itself to transverse scaling. The concept provides a high performance, scalable microactuator technology using conventional electroceramic fabrication and processing technology.

Figure 5:
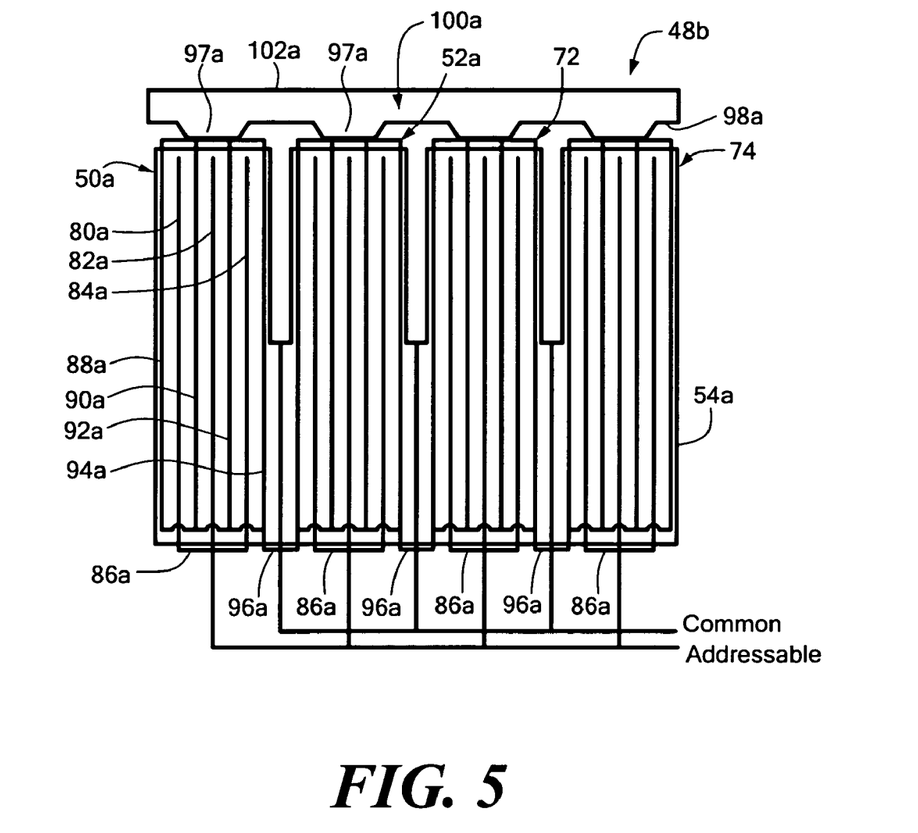
FIG. 5 is a simplified schematic view similar to FIG. 4 but with the common electrodes brought out through the support structure.

Although in FIG. 4 the transverse electrodisplacive actuator array according to this invention was shown having its common electrode 96 carried by the mounting surface 98 of reflective member 100 this is not a necessary limitation of the invention. As shown in FIG. 5, in array 48b, reflective member 100a may be constructed without a contact on its mounting surface 98a and instead the common contacts 96a for the common electrodes may be established at surface 99. In that way the array including actuators 50a, 52a, 72 and 74 may be fully powered and tested before the reflective member, 100a is attached by bonding or adhesive.

Figure 6:
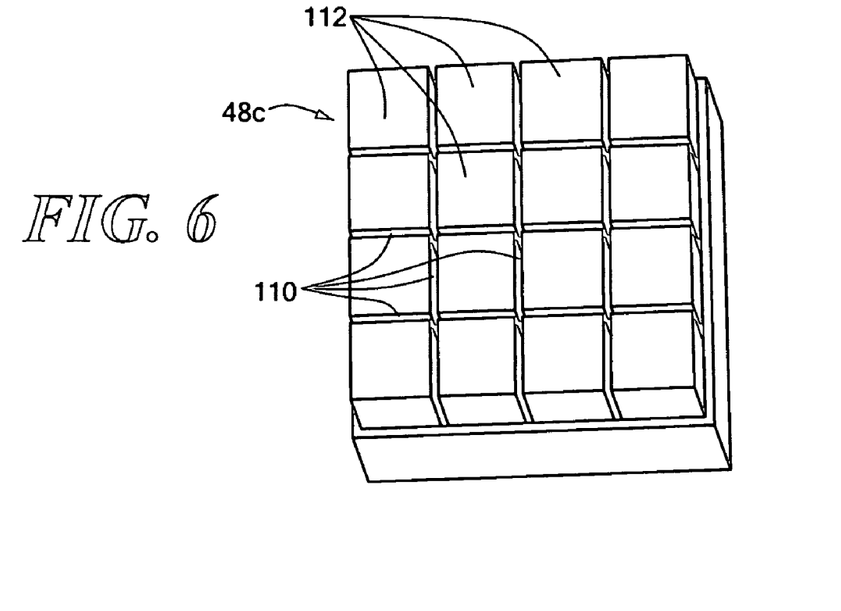
FIGS. 6 and 7 are three dimensional views of a transverse electrodisplacive actuator array according to this invention with increasing numbers of actuator elements.
Figure 7:
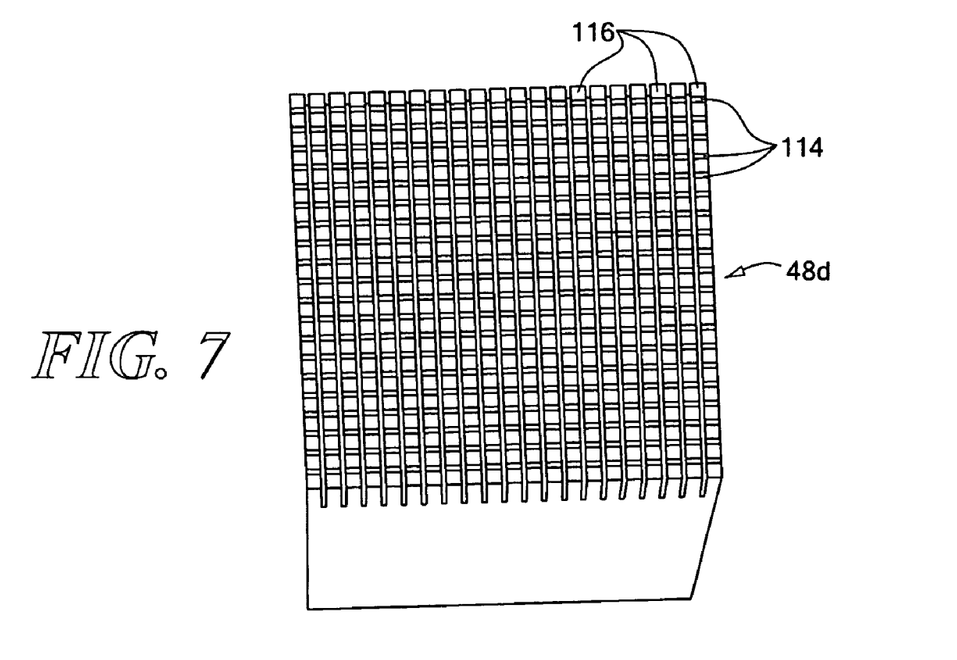

The entire array, both the support structure 54a, and the actuators 50a, 52a, 72 and 74 may be made by effecting cuts in two mutually perpendicular directions down into a block of suitable material ferric ceramic with the cuts or kerfs effecting the separation of the actuators into the individual elements. There may just a few cuts, 100, and resulting actuators, 112, as shown with respect to array 48c, FIG. 6 or there may be many cuts, 114, resulting in many actuators, 116, as shown with respect to array 48d, FIG. 7. The interconnection of transverse electrodisplacive actuator array 48e, FIG. 8 having a multiplicity of actuators 120, carried by support structure 122, may be made by forming the contacts 86a and 96a, FIG. 5, on the lower surface 123, FIG. 8, using solder pads, 124, on top of which is fastened a socket grid array, 126, to receive the pin grid array, 128 carried by flex cable 130.

Figure 8:
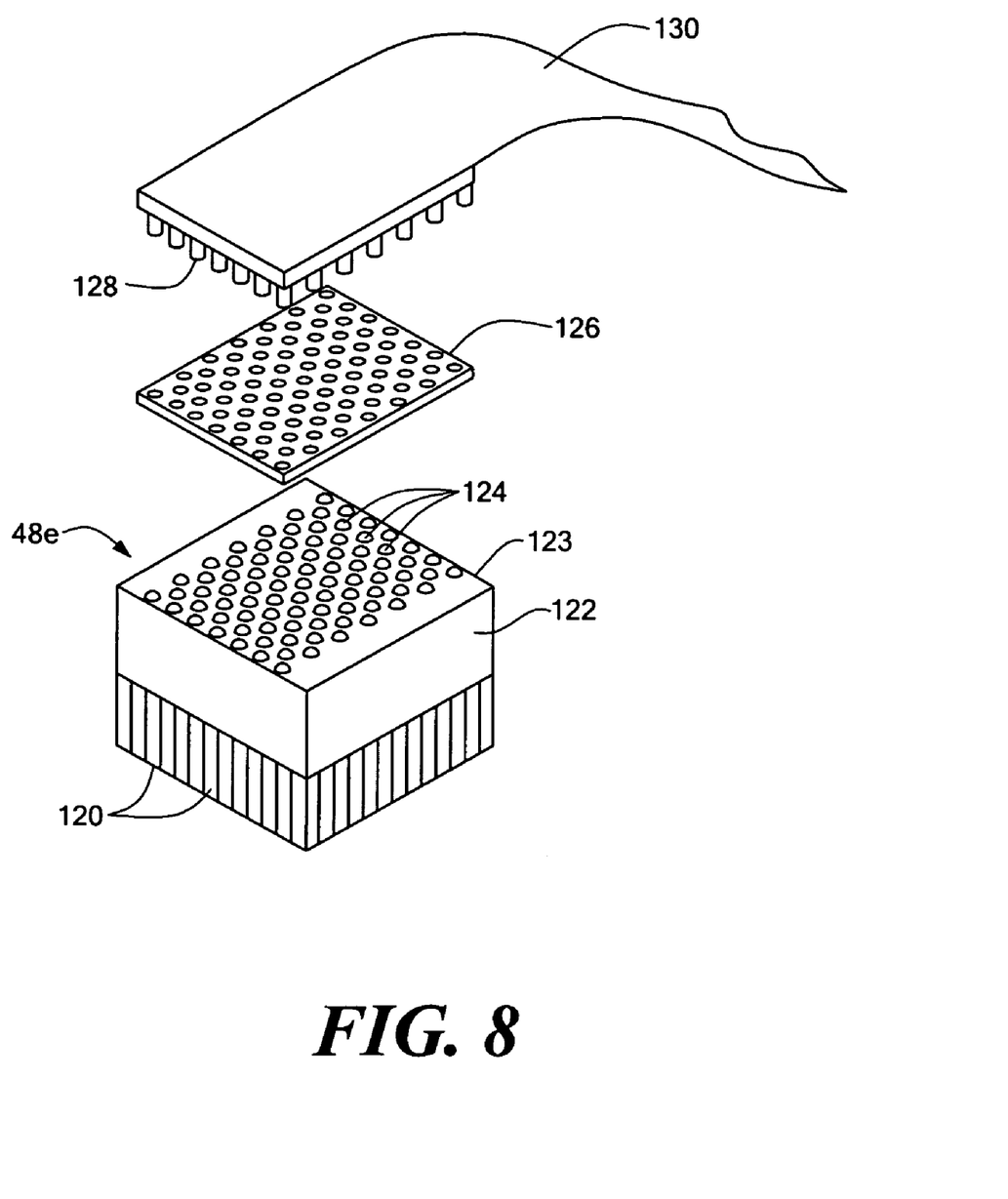
FIG. 8 is an exploded three dimensional view of the transverse electrodisplacive actuator array of FIG. 7 and its electrical interconnection.
Figure 9:
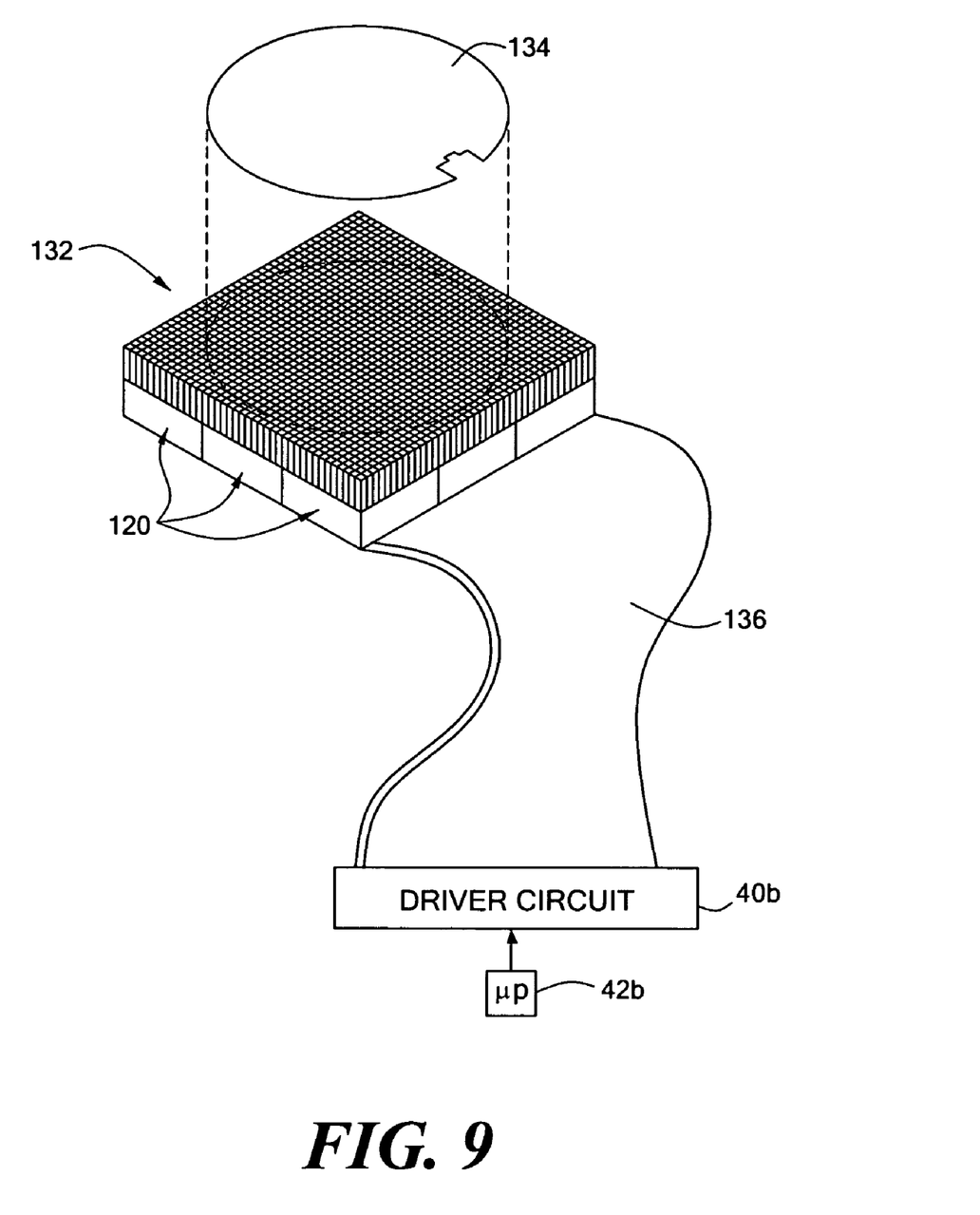
FIG. 9 is a three dimensional view of number of arrays of FIG. 7 in a modular arrangement with a driver circuit.
Figure 10A:
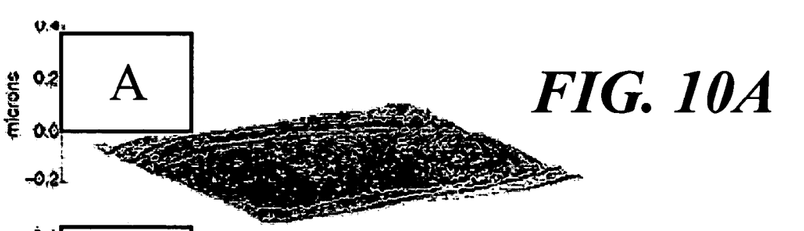
FIGS. 10A–D illustrate the localized deformation of the mirror surface by the transverse electrodisplacive actuator array of the invention.
Figure 10B:
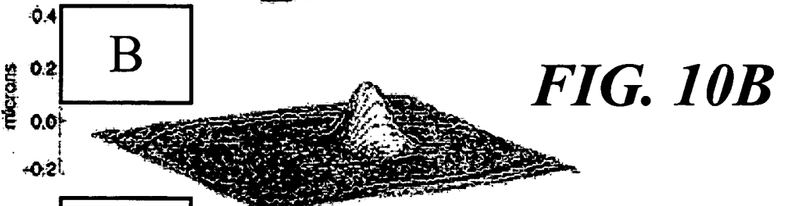
Figure 10C:
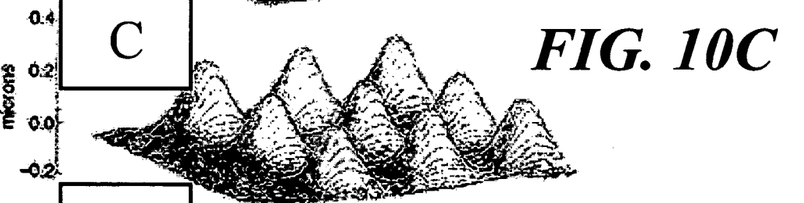
Figure 10D:
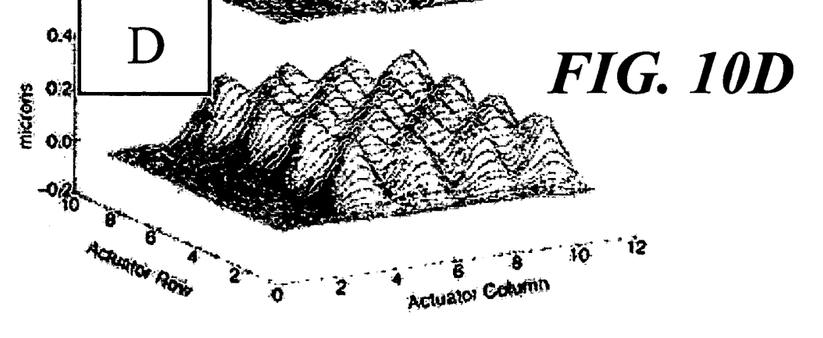

The advantageous modularity of the transverse electrodisplacive actuator array according to this invention is displayed in FIG. 9, where it can be seen that a number of smaller transverse electrodisplacive actuator arrays 120, FIG. 8 are combined in FIG. 9, to form a larger assembly, 132, to accommodate a much larger reflective member 134 which also may be a continuous surface. Now all of the flex cables represented by a single cable, 136, are connected to driver circuit, 40*b*, which is driven by microprocessor 42*b*. With selected programming of driver circuit 40*b* by microprocessor 42*b*, it is possible to have an unenergized active aperture as shown in FIG. 10A; a single actuator energized to about 250 nm as shown in FIG. 10B, every third actuator energized as shown in FIG. 10C or every other actuator energized as shown in FIG. 10D. Multiple modules comprising 441 actuators or more having one millimeter spacing arranged in 21 by 21 arrays have been demonstrated. Mirror deformations have been obtained, which are 0.25 micrometers at 100 volts and are repeatable to $\lambda/1000$ rms. The average capacitance for each actuator may be 30 nf while the average stroke may be 250 nm.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A transverse electrodisplacive actuator array for controlling the optical phasing of a reflective surface comprising:

a support structure;

a plurality of ferroic electrodisplacive actuator elements extending from a proximate end at said support structure to a distal end; each actuator element including at least one addressable electrode and one common electrode spaced from said addressable electrode and extending along the direction of said proximate and distal ends along a transverse strain axis;

a reflective member having a reflective surface and a mounting surface mounted on said actuator elements; and a plurality of addressable contacts and at least one common contact for applying voltage to said addressable and common electrodes to induce a transverse strain in addressed actuator elements to effect an optical phase change in the reflective surface at the addressed actuator elements.

2. The transverse electrodisplacive actuator array of claim 1 in which said support structure and said actuator elements are integral.

3. The transverse electrodisplacive actuator array of claim 1 in which said actuator elements are electrostrictive.

4. The transverse electrodisplacive actuator array of claim 1 in which said actuator elements are magnetostrictive.

5. The transverse electrodisplacive actuator array of claim 1 in which said actuator elements are piezoelectric.

6. The transverse electrodisplacive actuator array of claim 1 in which said actuator elements are lead magnesium niobate.

7. The transverse electrodisplacive actuator array of claim 1 in which said addressable contacts are on a surface of said support structure.

8. The transverse electrodisplacive actuator array of claim 7 in which said addressable electrodes extend through said support structure to said addressable contacts.

9. The transverse electrodisplacive actuator array of claim 1 in which said common contact is on a surface of said support structure.

10. The transverse electrodisplacive actuator array of claim 9 in which said common electrodes extend through said support structure to said common contact on said support structure.

11. The transverse electrodisplacive actuator array of claim 1 in which said common contact is on the said reflective member.

12. The transverse electrodisplacive actuator array of claim 11 in which said common electrodes extend through said actuator elements to said common contact on said reflective member.

13. The transverse electrodisplacive actuator array of claim 1 in which said actuator elements are a ferroelectric material.

14. The transverse electrodisplacive actuator array of claim 1 in which said actuator elements are a ferromagnetic material.

15. The transverse electrodisplacive actuator array of claim 1 in which said actuator elements are a lead zirconate titanate.

16. The transverse electrodisplacive actuator array of claim 1 in which said actuator elements are a ferroic ceramic.

17. The transverse electrodisplacive actuator array of claim 1 in which said actuator elements are single crystal materials.

* * * * *